(12) United States Patent
Agnello et al.

(10) Patent No.: US 10,739,394 B2
(45) Date of Patent: Aug. 11, 2020

(54) METHOD AND APPARATUS FOR MEASURING ELECTROSTATIC CHARGE OF A SUBSTRATE

(71) Applicant: CORNING INCORPORATED, Corning, NY (US)

(72) Inventors: Gabriel Pierce Agnello, Corning, NY (US); Peter Knowles, Elmira, NY (US); Correy Robert Ustanik, Davidson, NC (US)

(73) Assignee: Corning Incorporated, Corning, NY (US)

(*) Notice: Subject to any disclaimer, the term of this patent is extended or adjusted under 35 U.S.C. 154(b) by 80 days.

(21) Appl. No.: 15/781,226

(22) PCT Filed: Nov. 30, 2016

(86) PCT No.: PCT/US2016/064100
§ 371 (c)(1),
(2) Date: Jun. 4, 2018

(87) PCT Pub. No.: WO2017/095857
PCT Pub. Date: Jun. 8, 2017

(65) Prior Publication Data
US 2018/0356452 A1 Dec. 13, 2018

Related U.S. Application Data

(60) Provisional application No. 62/262,638, filed on Dec. 3, 2015.

(51) Int. Cl.
*G01R 29/24* (2006.01)
*G01R 31/28* (2006.01)
*G06F 1/00* (2006.01)

(52) U.S. Cl.
CPC ......... *G01R 29/24* (2013.01); *G01R 31/2831* (2013.01)

(58) Field of Classification Search
CPC ........ G05B 1/00; G05B 2219/00; G06K 1/00; G06K 2207/00; G03G 5/00;
(Continued)

(56) References Cited

U.S. PATENT DOCUMENTS 3,876,917 A 4/1975 Gaynor et al.
5,461,324 A 10/1995 Boyette et al.
(Continued)

FOREIGN PATENT DOCUMENTS

CN 102608440 A 7/2012
CN 102879658 A 1/2013
(Continued)

OTHER PUBLICATIONS

International Search Report and Written Opinion of the International Searching Authority; PCT/US2016/064100; dated Mar. 14, 2017; 9 pages; Korean Patent Office.

*Primary Examiner* — Jermele M Hollington
*Assistant Examiner* — Temilade S Rhodes-Vivour
(74) *Attorney, Agent, or Firm* — Ryan T. Hardee

(57) ABSTRACT

Disclosed herein are apparatuses and methods for measuring electrostatic charge on a surface of a substrate. The apparatuses comprise a substrate mounting platform, a substrate contacting component, and at least one voltage sensor, wherein the apparatus is programmed to independently control the rotational and translation velocity of a roller and/or to measure a voltage of the substrate at multiple points to produce a two-dimensional map of voltage for at least a portion of the substrate.

19 Claims, 5 Drawing Sheets

(58) Field of Classification Search
CPC ... G03G 2215/00; G06F 1/00; G06F 2101/00; H01L 21/00; H01L 2221/00
See application file for complete search history.

(56) References Cited

U.S. PATENT DOCUMENTS

| | | | | |
|---|---|---|---|---|
| 5,983,043 | A * | 11/1999 | Ohwaki | G03G 15/5037 324/457 |
| 6,391,506 | B1 * | 5/2002 | Yanagida | G03G 9/1075 430/106.3 |
| 7,127,201 | B2 * | 10/2006 | Takenouchi | G03G 15/0131 399/297 |
| 7,158,733 | B2 * | 1/2007 | Doi | G03G 15/065 399/55 |
| 7,692,804 | B2 * | 4/2010 | Naito | G03G 15/043 358/1.13 |
| 8,339,637 | B2 * | 12/2012 | Nakazato | G06F 3/121 358/1.14 |
| 8,401,445 | B2 * | 3/2013 | Uno | G03G 15/346 399/266 |
| 8,897,675 | B2 | 11/2014 | Liu et al. | |
| 9,772,361 | B2 | 9/2017 | Takiguchi et al. | |
| 2012/0183316 | A1 * | 7/2012 | Tabb | G03G 15/0266 399/50 |
| 2013/0121714 | A1 * | 5/2013 | Tanaka | G03G 15/1675 399/66 |
| 2014/0253160 | A1 | 9/2014 | Brunner | |

FOREIGN PATENT DOCUMENTS

| JP | 1993273835 A | 10/1993 |
|---|---|---|
| JP | 2014016178 A | 1/2014 |

\* cited by examiner

METHOD AND APPARATUS FOR MEASURING ELECTROSTATIC CHARGE OF A SUBSTRATE

CROSS-REFERENCE TO RELATED APPLICATIONS

This application claims the benefit of priority under 35 U.S.C. § 371 of International Patent Application Serial No. PCT/US2016/064100, filed on Nov. 30, 2016, which in turn, claims the benefit of priority of U.S. Provisional Patent Application Ser. No. 62/262,638 filed on Dec. 3, 2015, the contents of each of which are relied upon and incorporated herein by reference in their entireties.

FIELD OF THE DISCLOSURE

The disclosure relates generally to an apparatus and method for measuring electrostatic charge on a surface of a substrate and more particularly to an apparatus for generating and measuring electrostatic charge on a glass substrate under a variety of operating conditions.

BACKGROUND

After production, substrates are often subjected to downstream processing and handling steps that may generate electrostatic charge ("ESC"). For example, a glass substrate may be subjected to various conveyance and/or positioning processes during which the contact of the substrate with one or more components may cause undesirable ESC build-up on either the surface in contact with the component ("B surface" or "conveyance surface") and/or the reverse surface ("A surface" or "fabrication surface") of the substrate. Excessive ESC on either the A surface or the B surface can be undesirable, and potential differences on the A surface of the substrate may pose serious issues during fabrication leading to significant losses in yield, particularly in the case of fabrication of electronic devices, including without limitation fabrication of thin film electronic devices as may be employed during the manufacture of display devices.

During the fabrication process, a conveyance system may be used to transport the substrate from one process station to another. Generally, conveyance systems can comprise a number of small rollers, which may be free-rolling and/or driven. Contact between the B surface of the substrate and the rollers can itself result in ESC build-up on the A and/or B surface. Further, if one or more roller is moving at a different speed than the rest of the rollers in the conveyance system, e.g., a free-rolling or driven roller that is not sufficiently lubricated, the ESC build-up can be further increased.

Another ESC generating process can include vacuum processes, e.g., vacuum chucking, during which the substrate is held in place by a vacuum on a contact surface. The pulling of the substrate by the vacuum can impart charge to the substrate through friction between the substrate and the contact surface area surrounding the vacuum port, as well as through intimate contact between the substrate and the contact surface, during which time charge may be exchanged through van der Waals interactions. ESC build-up can also result from contact between the substrate and other surfaces during the fabrication process, e.g., by rubbing and/or friction.

Current methods and apparatuses for measuring and simulating ESC generating activities are limited, either by poor range of movement, the inability to test more than one type of ESC generating activity, and/or by the inability to evaluate ESC generation as a function of location on the substrate surface. One method for generating and measuring ESC on a substrate is the rolling sphere test, in which a circular rolling ball is contacted with a substrate. However, the use of a circular rolling ball may provide a limited motion profile and may not accurately simulate roller conveyance. In particular, the contacting of a stationary substrate with a rolling ball or the contacting of a moving substrate with a stationary roller ball is not substantially similar to an actual roller conveyance process in which a moving substrate contacts a spinning or rotating roller, e.g., when the roller rotational velocity and the substrate translation velocity may be independent of one another. Moreover, the rolling sphere test provides no information with respect to ESC generation due to vacuum lift and/or frictive contact. Finally, the rolling sphere test provides no method by which all or a portion of the surface of the substrate can be mapped and evaluated in terms of ESC build-up.

Accordingly, it would be advantageous to provide an improved methods and apparatuses for generating and measuring ESC on a surface of a substrate. It would also be advantageous to provide methods and apparatuses which can more accurately simulate one or more types of ESC generating activities.

SUMMARY

The disclosure relates, in various embodiments, to apparatuses for measuring electrostatic charge, the apparatuses comprising a substrate mounting platform; an interchangeable contacting component removably mounted to a multi-axis actuating component; and at least one voltage sensor; wherein the apparatus is programmed to contact the substrate with the interchangeable contacting component to generate an electrostatic charge; and wherein the at least one voltage sensor is configured to measure a voltage of the substrate at multiple points to produce a two-dimensional map of voltage for at least a portion of the substrate.

Also disclosed herein are apparatuses for measuring electrostatic charge, the apparatuses comprising a substrate mounting platform; a substrate contacting component comprising at least one roller component; and at least one voltage sensor; wherein the apparatus is programmed to (a) rotate the roller component at a rotational velocity, (b) contact the substrate with the at least one rotating roller component to generate an electrostatic charge; and (c) translate the substrate and the at least one rotating roller component relative to each other in a first direction at a translation velocity; and wherein the rotational velocity is controlled independently from the translation velocity.

Further disclosed herein are methods for measuring electrostatic charge, the methods comprising positioning a substrate in the apparatuses disclosed herein and measuring the voltage of at least one location on a surface of the substrate during or after contact with the surface contacting component. In some embodiments, the methods can comprise positioning a substrate on a substrate mounting platform of an apparatus, wherein the apparatus further comprises at least one voltage sensor and a contacting component comprising at least one roller component; rotating the at least one roller component at a rotational velocity; contacting the substrate with the at least one roller component to generate an electrostatic charge; translating the substrate and the at least one roller component relative to each other in a first direction at a translation velocity; and measuring a voltage of at least one location on a surface of the substrate during or after contact with the at least one roller component, wherein the rotational velocity is controlled independently from the translation velocity. In additional embodiments, the methods can further comprise neutralizing at least a portion of a surface of the substrate prior to or after contact with the contacting component. According to further embodiments, the substrate may comprise a glass sheet.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be further understood when read in conjunction with the following drawings.

DETAILED DESCRIPTION

Apparatuses

Disclosed herein are apparatuses for measuring electrostatic charge, the apparatuses comprising a substrate mounting platform; a substrate contacting component comprising at least one roller component; and at least one voltage sensor; wherein the apparatus is programmed to (a) rotate the roller component at a rotational velocity, (b) contact the substrate with the at least one rotating roller component to generate an electrostatic charge; and (c) translate the substrate and the at least one rotating roller component relative to each other in a first direction at a translation velocity; and wherein the rotational velocity is controlled independently from the translation velocity.

Also disclosed herein are apparatuses for measuring electrostatic charge, the apparatuses comprising a substrate mounting platform; an interchangeable contacting component removably mounted to a multi-axis actuating component; and at least one voltage sensor; wherein the apparatus is programmed to contact the substrate with the interchangeable contacting component to generate an electrostatic charge; and wherein the at least one voltage sensor is configured to measure a voltage of the substrate at multiple points to produce a two-dimensional map of voltage for at least a portion of the substrate.

Figure 1A:
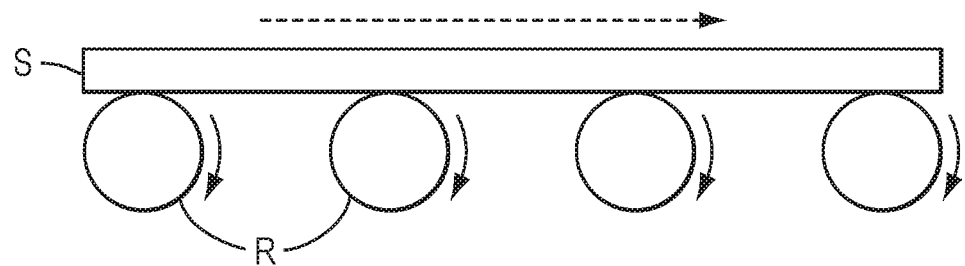
FIGS. 1A-C illustrate various ESC generating activities such as roller conveyance, vacuum chucking, and frictive contact.
Figure 1B:
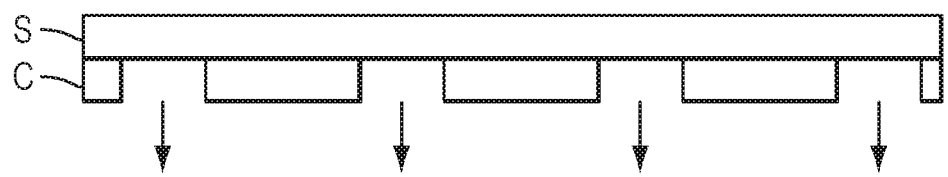
Figure 1C:

FIGS. 1A-C illustrate various contact scenarios that can generate ESC on one or more surfaces of a substrate. For example, roller conveyance is illustrated in FIG. 1A, in which a substrate S is conveyed in a first direction (indicated by the dashed arrow) using a plurality of rollers R rotating in a second direction (indicated by the solid arrows). Vacuum chucking is illustrated in FIG. 1B, in which substrate S is pulled in a first direction (indicated by the solid arrows) and brought into contact with a contact surface C. Finally, frictive contact is illustrated in FIG. 1C, in which substrate S is rubbed against contact surface C. As used herein, frictive contact is intended to denote the generation of friction between a substrate and another surface, e.g., by translating S and C relative to each other in opposing directions (as shown by the dashed arrows in FIG. 1C) or in the same direction, e.g., at different speeds (not shown), or moving one of S and C with respect to the other (not shown). As used herein, the phrase "translated relative to each other" is intended to denote that at least one of the substrate and/or substrate contacting component are moving with respect to the other, e.g., a moving substrate and stationary component, moving component and stationary substrate, or a moving substrate and a moving component.

Figure 2:
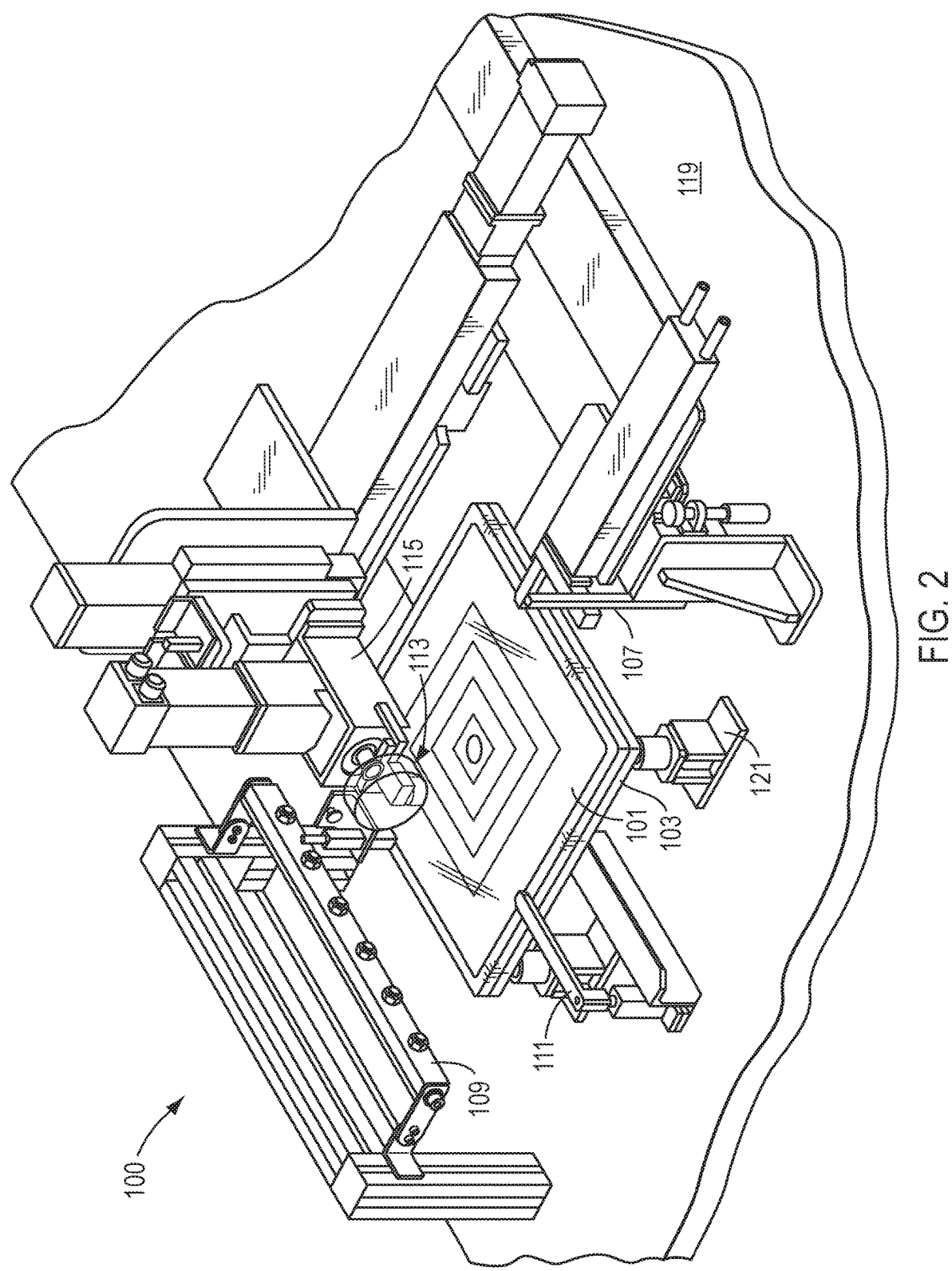
FIG. 2 illustrates an ESC measuring apparatus according to certain embodiments of the disclosure.

Referring to FIG. 2, which depicts an exemplary ESC measuring system 100, a substrate 101 can be positioned on a substrate mounting platform 103. The substrate can be chosen from any material capable of generating an electrostatic charge, including but not limited to glass substrates, plastic substrates, metal substrates, ceramic substrates, and other similar substrates. In one embodiment, the substrate 101 is a glass substrate, e.g., a glass sheet. After positioning the substrate 101 on the substrate mounting platform 103, the substrate 101 can optionally undergo a neutralization step in which it is treated to reduce ESC build-up. In some embodiments, carrying out a neutralization step may result in increased accuracy of the subsequent ESC measuring step discussed below.

Figure 3:
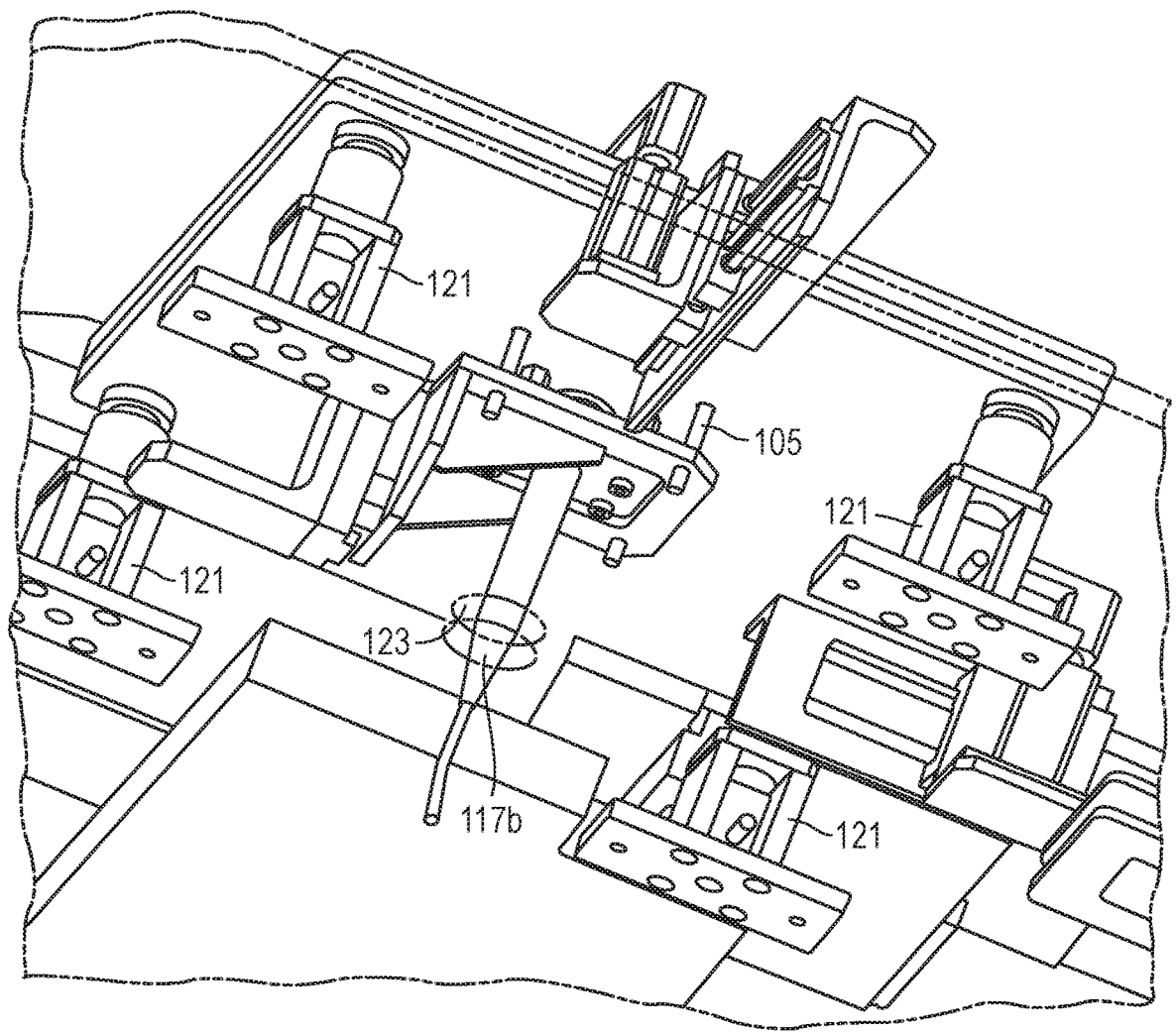
FIG. 3 illustrates a bottom view of the ESC measuring apparatus depicted in FIG. 2.

During the neutralization step, the substrate 101 may be lifted or otherwise positioned in proximity to a neutralization device 109, e.g., above the substrate mounting platform 103. For example, as illustrated in FIG. 3, the substrate 101 may be lifted using mounting pins 105 and aligned with neutralization device 109. Neutralization device 109 can neutralize one or more surfaces of substrate 101, such as the top and bottom surfaces (not labeled), or a portion thereof. The neutralization device 109 may provide a flow of ionized air over one or more surfaces of the substrate 101. The neutralization device 109 may, in certain embodiments, be a high current ionizer operating with an inert gas source, e.g., Ar or $N_2$.

With reference to FIG. 2, in some embodiments, a static feedback sensor 107 can be positioned proximate the substrate (e.g., above the substrate) before and/or during neutralization of the substrate 101. The static feedback sensor 107 can measure the voltage of the substrate 101 during neutralization. Once a predetermined voltage indicative of a desired level of substrate neutralization is reached (e.g., <~5 V), the neutralization process may be discontinued. The feedback sensor 107 may then be retracted, the mounting pins 105 may be lowered, and/or the substrate 101 may be repositioned or brought back into contact with the substrate mounting platform 103.

The substrate 101 may be secured to the substrate mounting platform 103 using any suitable fastening mechanism, e.g., clamps 111, vacuum chucking, and other similar components or methods, or combination thereof. Once the substrate 101 is secured to the substrate mounting platform 103 and optionally neutralized, a contacting step can be initiated using a substrate contacting component 113, which can be programmed or designed to simulate one or more desired ESC generating activities.

Figure 4A:
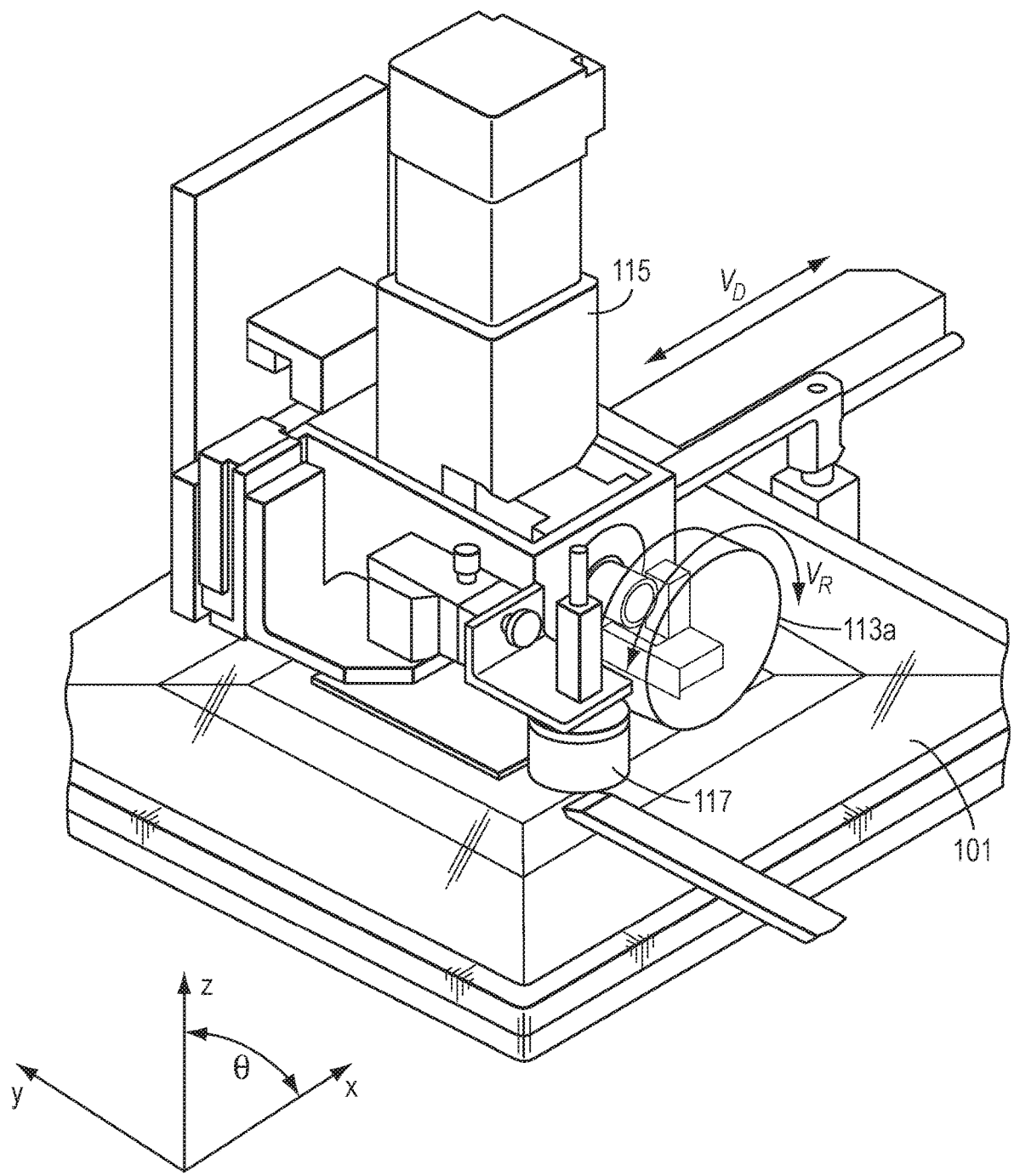
FIGS. 4A-B illustrate substrate contacting components according to various embodiments of the disclosure.

One non-limiting embodiment of an interchangeable contacting component is illustrated in FIG. 4A, in which the contacting component is a roller component 113a. Such a contacting component may be programmed or designed to simulate the passing of a substrate over a roller conveyor (e.g., the motion illustrated in FIG. 1A). The roller component 113a can, in some embodiments, be removably secured to a multi-axis actuated component 115, which can be used to position the roller 113a at various locations on the substrate 101. The multi-axis actuated component 115 can be actuated to move the roller component 113a along four axes or in four directions, e.g., x, y, z, and θ, as depicted in FIG. 4A. Directions x and y can represent two-dimensional motion parallel to the plane of the substrate, whereas direction z can represent one-dimensional motion perpendicular to the plane of the substrate. Further, θ can represent the rotational motion of the roller component 113a.

Figure 4B:
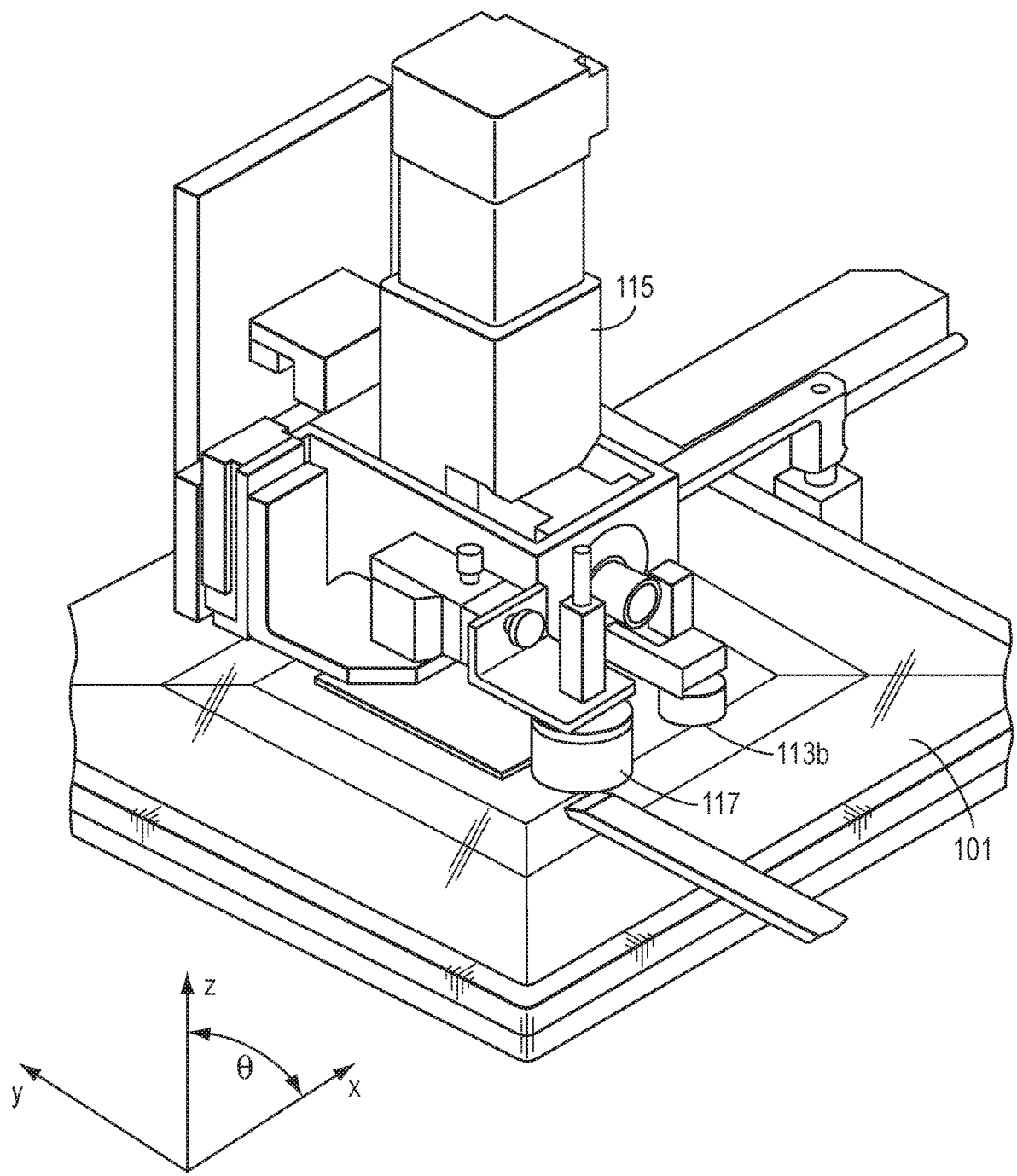

In another embodiment, as illustrated in FIG. 4B, the interchangeable contacting component can be a surface component 113b, which can be programmed or designed to simulate frictive or non-frictive contact of the substrate with another surface (e.g., the frictive motion illustrated in FIG. 1C). As used herein, "non-frictive" contact is intended to denote contact between the substrate and another surface in which neither the substrate nor the other surface are moved in relation to one another. For example, a substrate resting on a stationary work surface can be described as being in non-frictive contact with the work surface. In an alternative embodiment, the substrate contacting component may also include a vacuum element (not illustrated), for example, a vacuum may be drawn between the substrate 101 and the surface component 113b, which can simulate vacuum chucking, lifting, or otherwise conveying a substrate (e.g., the motion illustrated in FIG. 1B). A "vacuum component" as used herein is intended to refer to a surface contacting component equipped with a vacuum element. The surface component 113b and/or the vacuum component can, in some embodiments, be secured to a multi-axis actuated component 115, which can be used to position the surface component 113b at various locations on the substrate 101.

Referring again to FIG. 2, the electrostatic measurement apparatus can further comprise an assembly platform 119 and load cells 121, which can be used to position the substrate mounting platform 103, multi-axis actuated component 115, neutralizing device 109, and/or sensors (e.g., static feedback sensor 107 or voltage sensor 117) in various positions relative to each other. The assembly platform 109 can also be equipped with a heating element and/or vacuum device (not illustrated). The heating element can be used, for example, to raise the temperature of the substrate to a desired temperature for testing (e.g., from about 50° C. to about 200° C.). The vacuum device can be used to draw a vacuum between the substrate 101 and the platform 103 to secure the substrate in place for testing. Clamps 111 may also be used for securing the substrate 111 and may be adjustable for different substrate sizes.

The electrostatic measurement apparatus can further include one or more voltage probes or sensors. As illustrated in FIGS. 4A-B, voltage sensors 117 can be attached to the multi-axis actuated component 115 or otherwise positioned proximate to or in contact with the top surface of substrate 101. Alternatively, as illustrated in FIG. 3, a voltage sensor 117b can be positioned underneath the substrate 101 to measure the electrostatic charge of the bottom surface of substrate 101. The voltage sensor 117b may be positioned proximate to or in contact with the bottom surface of substrate 101 via a hole or other opening 123 in the mounting platform 103. It is noted that voltage sensor 117 can be distinct from feedback sensor 107, which measures voltage during the optional neutralization step.

The substrate contacting component 113 can, in some embodiments, be removably secured to a multi-axis actuated component 115. The multi-axis actuated component 115 can be positioned proximate (e.g., above) the substrate mounting platform 103 and actuated to provide motion in the x, y, z, and/or θ directions. The multi-axis actuated component 115 can, for instance, includes a servomotor (not shown) comprising at least one motor and a positioning sensor. The multi-axis actuated component 115 can further include programming for carrying out desired motions or sequences. The motor can be used to power the movement of the multi-axis actuated component 115 based on the programming selected for a given substrate 101 and substrate contacting component 113. In certain embodiments, a separate rotary motor may be used when a roller component 113a is employed, and this second motor can be used to power the spinning of the roller component.

According to various embodiments, the different substrate contacting components 113 can be used interchangeably with the multi-axis actuating component 115. For example, the interchangeable contacting components 113 may be configured to allow for ease of installation and removal such that one contacting component can be switched out for another to take several different measurements for a given substrate. The servomotor of the multi-axis actuating component 115 can be programmed by the user to operate the apparatus differently depending on which substrate contacting component 113 is installed.

As shown in FIGS. 4A-B, one or more voltage sensors 117 can be mounted to the multi-axis actuated component 115, e.g., proximate or adjacent to the substrate contacting component 113. The voltage sensor can be chosen, in some embodiments, from a high voltage or low voltage electrostatic voltmeter or a high voltage field meter. As would be readily understood by a person having ordinary skill in the art, the particular type of voltage sensor can be chosen based on the particular application. Similar to the substrate contacting component 113, the voltage sensor 117 can be moved by the multi-axis actuated component 115 in the x, y, and z directions. The movement of the voltage sensor 117 can vary based on the particular substrate contacting component 113 and measurement protocol. In certain embodiments, the voltage sensor 117 can be mounted to the multi-axis actuated component 115 via a pneumatic cylinder (not shown), which can also be controlled, e.g., by the servomotor. The pneumatic cylinder may allow the voltage sensor 117 to be moved along the z-axis, e.g., moved toward and away from the substrate surface. The voltage sensor 117 and/or ECS measurement apparatus can also include a memory drive, which may be used to record voltage measurements.

Measurements can be taken once or more than once, and can be taken before, during, and/or after contacting the substrate with the substrate contacting component 113. For example, a single measurement can be made before, during, and/or after contact, intermittent measurements may be made during movement of the substrate contacting component 113, or continuous measurements may be made during movement of the substrate contacting component 113. As such, in various embodiments, the electrostatic charge across a substrate can be measured or mapped relative to location on a surface, such as a single location measurement, multiple location measurements, one-dimensional mapping, or two-dimensional mapping.

It is to be understood that the embodiments disclosed in FIGS. 2-4 are exemplary only and are not intended to be limiting on the claims in any manner, for example, in terms of orientation, scale, relative positioning of components, and so on. Solely for illustrative purposes, various aspects of each component are described in more detail below.

The substrate mounting platform 103 is not limited to any particular size, but may, for example, have at least one dimension (e.g., length and/or width) ranging from about 10 cm to about 100 cm, e.g., from about 30 cm to about 60 cm. Lift pins 105 can be used, in some embodiments, to lift substrate 101 off the mounting platform 103, e.g., into proximity with the neutralizing device 109. The lift pins 105 can, for example, lift substrate 101 to a distance ranging from about 0.5 cm to about 5 cm, such as from about 1 cm to about 2.5 cm. The multi-axis actuated component 115 can be configured to translate any given distance in the x, y, and z directions, and to rotate a roller at any given speed in the Θ direction. For example, the multi-axis actuated component 115 can travel a distance in the x and/or y direction ranging from about 10 cm to about 100 cm, e.g., from about 25 cm to about 50 cm, and a distance in the z direction ranging from about 1 cm to about 10 cm, such as from about 2.5 cm to about 5 cm.

In certain embodiments, the roller 113a can have a diameter ranging from about 1 cm to about 10 cm, such as from about 2.5 cm to about 5 cm. The roller 113a can simultaneously spin in the Θ direction while traveling in the x, y, and/or z directions. According to various embodiments, the servomotor can be programmed to vary the phase of the roller component 113a and therefore control the frictive contact between the roller component 113a and the substrate 101. As used herein, "phase" is intended to denote the +/− % value of the rotational speed of the roller relative to the linear speed of the roller with respect to the substrate (e.g., along the x axis), which can be related, for example, by the circumference of the roller. By independently controlling the rotational speed and/or translation speed, various measurement protocols can be developed for different rotation/friction ratios, thus providing a wide variety of simulations. The roller can be constructed of any material, e.g., materials with which a substrate may come into contact during end-use operations, such as glass, plastic, metal, ceramic, and the like.

According to additional embodiments, the surface component 113b can have any given shape or size suitable for simulating and measuring electrostatic charge induced by vacuum, non-frictive surface contact, and/or frictional contact. In some embodiments, the surface component 113b can comprise a block or puck of any given material, e.g., having a cross-section in the shape of a square, rectangle, circle, oval, or any other regular or irregular shape. According to additional embodiments, the surface component 113b can be further equipped with a vacuum component, such as a vacuum port. In some embodiments, the surface component 113b can comprise a square cross-section including a length ranging from about 1 cm to about 10 cm, such as from about 2.5 cm to about 5 cm, or can have a circular cross section including a diameter ranging from about 0.5 cm to about 5 cm, such as from about 1 cm to about 2.5 cm. The surface component can be constructed of any material, e.g., materials with which a substrate may come into contact during end-use operations, such as glass, plastic, metal, ceramic, and the like.

Methods

Disclosed herein are methods for measuring an electrostatic charge on a substrate, the methods comprising positioning the substrate in the apparatuses disclosed herein and measuring the voltage of at least one location on a surface of the substrate during or after contact with the substrate contacting component, e.g., at least one roller component. Solely for illustrative purposes, various measurement techniques will now be described in detail below. It is to be understood that these measurement techniques are exemplary only and are not intended to be limiting on the claims in any manner, for example, in terms of sequence, positioning, optional steps, and so on. It is also to be understood that the disclosed methods can be used not only to measure ESC build-up on a surface, but also to measure ESC dissipation on a surface over time.

Methods for measuring electrostatic charge generated by contact between the substrate and a rotating body, such as a roller or plurality of rollers, will be discussed with reference to the apparatus depicted in FIG. 4A. A substrate 101 may be secured to a mounting platform 103 and optionally neutralized as previously described. After securing and optionally neutralizing the substrate, the test may be initiated by moving the multi-axis actuated component 115 equipped with roller 113a along the z-axis toward the substrate surface. The multi-axis actuated component can be stopped at a specified "search" position, e.g., a few millimeters above the substrate surface. The search sequence can include moving the multi-axis actuated component down slowly in the z-direction toward the substrate surface while continuously monitoring the z-position stamped aggregate load cell signal (e.g., summation of all 4 load cells). The search sequence may be stopped once the load cell signal reaches or exceeds a user-defined target aggregate load cell set point. The multi-axis actuated component may then be repositioned to a point most closely associated with the target aggregate load cell set point. In some embodiments, the search sequence does not include any motion along the x- or y-axis.

After the search sequence is complete, the z-axis motion can be switched to load servo control. Once in load servo control, the roller can dwell in contact with the substrate for a user-defined stabilization period. Motion along the x-axis can engage simultaneously with rotary motion in the Θ direction. The linear and rotational accelerations of the roller may be coordinated such that they reach their target speeds at the same time. The phase for this motion may correspond to the +/− % value of the rotational speed $V_R$ of the roller relative to the translation speed along the x-axis $V_X$, e.g., phase=$(V_R/V_X)*100$. The phase can be varied either by independently changing the rotational speed $V_R$ or the translation speed $V_X$ of the roller. As opposed to the rolling sphere test, the methods disclosed herein are capable of simultaneous and independent control of movement in the x and θ directions to simulate roller conveyance. As such, the methods disclosed herein allow for the exploration of a wide array of rotation/friction ratios that can be controlled through phase adjustment.

Voltage sensor 117 can be secured to the multi-axis actuated component 115 proximate the roller 113a. The voltage sensor 117 can measure the voltage at one or more points along the path traveled by the roller 113a while the roller is in contact with substrate 101. Measurements can be taken once or multiple times at a desired interval for a specified period of time using a user-defined stroke length. After a user-defined period is complete, the simultaneous spinning and translation of the roller 113a may be discontinued. The multi-axis actuated component 115 can then raise the roller 113a until it is no longer in contact with substrate 101.

Methods for measuring electrostatic charge generated by contact between the substrate and a contact surface under vacuum, such as a vacuum chuck, will be discussed with reference to the apparatus depicted in FIG. 4B. Similar to the method described above, the substrate 101 may be secured to a mounting platform 103 and optionally neutralized. After securing and optionally neutralizing the substrate, search and stabilization sequences may also be carried out. Surface component 113b (comprising a vacuum element, not shown) may then be brought into contact with the substrate 101. Upon activation, the vacuum element can provide a predetermined suction force on the substrate 101 for a specified vacuum pull time, after which it can be disengaged. The vacuum pull process can be carried out one or more times. If more than one pull is specified, the specified amount of time between pulls may be allowed to lapse before the vacuum is reapplied. The cycle may be repeated until the desired number of pulls has been achieved. Preferably, while activated, the vacuum element does not move along the x, y, or z axes.

Upon completion of the final vacuum pull, the multi-axis actuated component 115 can retract along the z-axis after a specified time period to a specified distance above the substrate surface. The specified distance may, for example, depend on the working distance of the pneumatic cylinder mounted to the voltage sensor 117. The voltage sensor 117 can be positioned at a distance from the substrate surface of about 1 mm to about 5 mm for measurement. The multi-axis actuated component 115 can also move along the z- and y-axes to position the voltage sensor 117 over one or more areas charged by the vacuum pull. Measurements can be taken once or multiple times at a desired interval for a specified period of time. For example, a single point measurement can be taken at one location, a series of discrete single point measurements can be taken at specified x-y locations, or a continuous motion scan can be performed with x-y-z position stamping of measurements according to user-defined x-y start/stop/step positions. Stamping may include, for example, taking measurements along a defined raster over a predetermined surface or portion thereof. In some embodiments, the entire surface of the substrate 101 may be interrogated by voltage sensor 117 and mapped. Measurements can be carried out between one or more vacuum cycles if so specified by the user, or after the last vacuum cycle.

Methods for measuring electrostatic charge generated by contact between the substrate and a non-moving contact surface not under vacuum, such as resting on a work surface, will be discussed with reference to the apparatus depicted in FIG. 4B. Similar to the methods described above, the substrate 101 may be secured to a mounting platform 103 and optionally neutralized. After securing and optionally neutralizing the substrate, search and stabilization sequences may also be carried out. Surface component 113b (not comprising a vacuum element) may then be brought into contact with the substrate 101. After a user-specified dwell time in which surface component 113b is in non-frictive contact with the substrate surface, the multi-axis actuated component 115 can retract along the z-axis to position the voltage sensor 117 at a specified distance above the substrate surface. The multi-axis actuated component 115 can also move along the x- and y-axes to position the voltage sensor 117 over one or more areas charged by the surface contact. Measurements can be taken once or multiple times at a desired interval for a specified period of time, such as a single point measurement, discrete point measurements, or a continuous scan of at least a portion of the surface. Measurement and contact cycles can be repeated as desired.

Methods for measuring electrostatic charge generated by contact between the substrate and a frictive contact surface not under vacuum, such as conveyance along a non-rotating surface, will be discussed with reference to the apparatus depicted in FIG. 4B. Similar to the methods described above, the substrate 101 may be secured to a mounting platform 103 and optionally neutralized. After securing and optionally neutralizing the substrate, search and stabilization sequences may also be carried out. Surface component 113b (not comprising a vacuum element) may then be brought into contact with the substrate 101 and moved along the x- and/or y-axes according to a defined sequence or pattern at a user-defined velocity, acceleration, and/or repetition rate.

After the last contact cycle (or in between contact cycles if so desired) during which surface component 113b is in frictive contact with the substrate surface, the multi-axis actuated component 115 can retract along the z-axis to position the voltage sensor 117 at a specified distance above the substrate surface. The multi-axis actuated component 115 can also move along the x- and y-axes to position the voltage sensor 117 over one or more areas charged by the surface contact. Voltage measurements can be taken once or multiple times at a desired interval for a specified period of time, such as a single point measurement, discrete point measurements, or a continuous scan of at least a portion of the surface. Measurement and contact cycles can be repeated as desired.

In various embodiments, neutralization procedures may be carried out before measurement and/or after measurement. For example, pre-neutralization may improve the accuracy of the subsequent measurement, whereas post-neutralization may protect the voltage sensors from an unexpected voltage surge. Moreover, although the different substrate contacting components 113 and their respective methods are separately described above, it is noted that they can be used in combination on a single substrate 101. For example, after the use of the roller 113a to generate and measure ESC of the substrate, the substrate can be neutralized and then contacted by another interchangeable component, such as a surface component 113b or a vacuum component designed to simulate either frictive or non-frictive contact. Use of multiple interchangeable contacting components on a single substrate may provide increased ESC data which can be useful for downstream processing and handling of the substrate.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "at least one sensor" includes examples having two or more such sensors unless the context clearly indicates otherwise.

Ranges can be expressed herein as from "about" one particular value, and/or to "about" another particular value. When such a range is expressed, examples include from the one particular value and/or to the other particular value.

Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a device that comprises A+B+C include embodiments where a device consists of A+B+C and embodiments where a device consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

What is claimed is:

1. A method for measuring electrostatic charge, the method comprising:
   (a) positioning a substrate on a substrate mounting platform of an apparatus, wherein the apparatus further comprises at least one voltage sensor and a contacting component comprising at least one roller component;
   (b) rotating the at least one roller component at a rotational velocity;
   (c) contacting the substrate with the at least one roller component to generate an electrostatic charge;
   (d) translating the substrate and the at least one roller component relative to each other in a first direction at a translation velocity; and
   (e) measuring a voltage of at least one location on a surface of the substrate during or after contact with the at least one roller component,
   wherein the rotational velocity is controlled independently from the translation velocity.

2. The method of claim 1, further comprising neutralizing at least a portion of the surface of the substrate prior to or after contacting the substrate with the at least one roller component.

3. The method of claim 1, wherein the substrate contacting component is mounted to a multi-axis actuated component.

4. The method of claim 1, wherein the at least one voltage sensor is mounted to a multi-axis actuated component.

5. The method of claim 3, wherein the multi-axis actuated component further comprises a servomotor programmed to carry out steps (b)-(d).

6. The method of claim 1, wherein the voltage is measured at a single point on the surface of the substrate, at multiple points along a predetermined one dimensional path, or at multiple points along a predetermined two-dimensional path.

7. The method of claim 1, wherein measuring the voltage comprises producing a two-dimensional map of voltage for at least a portion of the substrate.

8. The method of claim 1, wherein the voltage is measured along a predetermined path of the at least one roller component while the at least one roller component is in contact with the substrate.

9. The method of claim 1, comprising contacting the surface with the at least one roller component and measuring the voltage of an opposing second surface of the substrate.

10. The method of claim 1, wherein the substrate is a glass sheet.

11. An apparatus for measuring electrostatic charge, the apparatus comprising:
    a substrate mounting platform;
    an interchangeable contacting component removably mounted to a multi-axis actuating component; and
    at least one voltage sensor;
    wherein the apparatus is programmed to contact the substrate with the interchangeable contacting component to generate an electrostatic charge; and
    wherein the at least one voltage sensor is configured to measure a voltage of the substrate at multiple points to produce a two-dimensional map of voltage for at least a portion of the substrate.

12. The apparatus of claim 11, wherein the interchangeable contacting component is selected from a roller component, a vacuum component, a frictive surface component, or a non-frictive surface component.

13. The apparatus of claim 11, further comprising a neutralizing device for reducing electrostatic charge on the substrate prior to or after contacting the substrate with the interchangeable contacting component.

14. The apparatus of claim 11, wherein the at least one voltage sensor is mounted to the multi-axis actuating component.

15. The apparatus of claim 11, wherein the interchangeable contacting component contacts a first surface of the substrate and the at least one voltage sensor measures a voltage of an opposing second surface.

16. The apparatus of claim 12, wherein the multi-axis actuated component further comprises a servomotor programmed to (a) contact the vacuum component with the substrate and (b) draw a vacuum to generate an electrostatic charge.

17. The apparatus of claim 12, wherein the multi-axis actuated component further comprises a servomotor programmed to (a) rotate the roller component, (b) contact the rotating roller component with the substrate, and (c) to translate the rotating roller component and substrate relative to each other to generate an electrostatic charge.

18. The apparatus of claim 12, wherein the multi-axis actuated component further comprises a servomotor programmed to contact the frictive surface component with the substrate and to translate the frictive surface component and substrate relative to each other to generate an electrostatic charge.

19. The apparatus of claim 11, wherein the at least one voltage sensor is configured to measure a voltage of at least one location on a surface of the substrate during or after contact with the interchangeable contacting component.

* * * * *